United States Patent [19]
Pan

[11] Patent Number: 6,067,441
[45] Date of Patent: May 23, 2000

[54] COUPLING DEVICE TO BE USED WITH A STANDARD NON-POWER PROVIDING DIRECTIONAL TAP FOR DRAWING AND MIXING AC POWER AND RF SIGNALS THEREFROM

[75] Inventor: Ying-Huei Pan, Taipei Hsien, Taiwan

[73] Assignee: Cable Vision Electronics Co., Ltd., Taipei Hsien, Taiwan

[21] Appl. No.: 08/724,743

[22] Filed: Oct. 2, 1996

[51] Int. Cl.[7] ................................. H04N 7/16; H04N 7/18
[52] U.S. Cl. ................................. 455/3.3; 348/6; 333/132; 340/310.08
[58] Field of Search ................................. 455/3.1, 3.3, 6.1, 455/6.2; 348/6, 8; 340/310.01, 310.02, 310.03, 310.04, 310.05–310.08; 375/257, 259; 333/124, 126, 129, 131, 132, 134, 136; H04N 7/10, 7/16

[56] References Cited

U.S. PATENT DOCUMENTS 3,872,408  3/1975  Reilly .................................. 333/6
3,895,318  7/1975  Ross ................................... 333/136
5,581,801  12/1996  Spriester et al. ...................... 455/3.1

*Primary Examiner*—Tommy P. Chin
*Assistant Examiner*—Quenedy Pierre-Louis
*Attorney, Agent, or Firm*—Townsend and Townsend and Crew LLP

[57] ABSTRACT

A device is to be coupled and used with a standard non-power providing directional tap and includes a power coupling unit and a power combining unit. The power coupling unit is adapted to be connected to an output port of the directional tap. The power coupling unit filters out RF signals from the output port and outputs an AC power signal from the output port. The power combining unit includes at least two sets of combining circuits with a common input port connected to the power coupling unit so as to receive the AC power signal therefrom. Each combining circuit has an RF input signal port adapted to be connected to a respective one of the RF signal ports of the directional tap so as to receive the RF signal therefrom, and a combined output signal port with an output which is the AC power signal from the common input port and the RF signal from the RF input signal port.

8 Claims, 5 Drawing Sheets

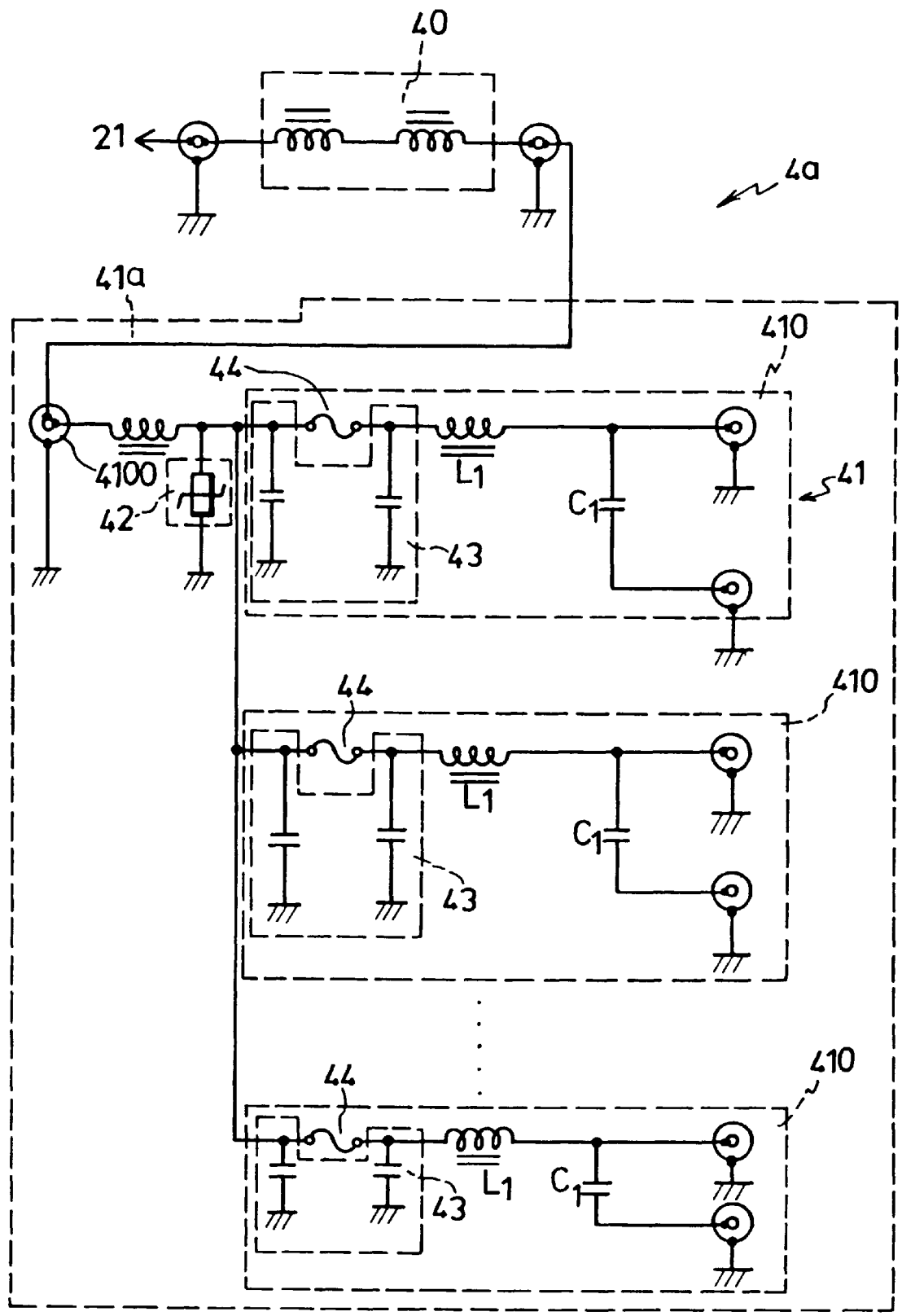
F I G. 5

COUPLING DEVICE TO BE USED WITH A STANDARD NON-POWER PROVIDING DIRECTIONAL TAP FOR DRAWING AND MIXING AC POWER AND RF SIGNALS THEREFROM

BACKGROUND OF THE INVENTION

1. Field of the Invention

The invention relates to a coupling device, more particularly to a coupling device that is adapted to be used with a standard non-power providing directional tap for drawing and mixing alternating current (AC) power and radio frequency (RF) signals therefrom.

2. Description of the Related Art

FIG. 1 illustrates how cable television signals are supplied to customers or subscribers 3 in a conventional manner. As shown, coaxial signal cables 1 are tapped by means of directional taps 2. The customers 3 are connected to these signal cables 1 via the directional taps 2. The signal cables 1 carry both AC power and RF signals. The AC power signal is used to drive RF signal amplifiers (not shown) distributed along the path from the cable television provider to the customers 3. The RF signal contains cable television signals. Currently, most of the known directional taps 2, such as those manufactured by Signal Vision Inc., Scientific Atlanta, General Instruments, Phillips and Regal, supply only the RF signal to the households 3.

Referring to FIG. 2, each directional tap 2 has a rear housing side that is provided with a clamping unit 25. The clamping unit 25 permits mounting of the directional tap 2 on an aerial support cable 5 that is parallel to the signal cables 1. The clamping unit 25 also permits mounting of the directional tap 2 to ground rods or in other applications, such as underground vaults, pedestals or security boxes.

In this multimedia age, network interface devices are being developed to enable customers to receive and send a variety of RF signals, such as television and telephone signals, along a single cable. Such network interface devices may require both AC power and RF signals as inputs. Thus, the conventional directional taps 2 are not adapted for use with the network interface devices.

In order to use the network interface devices, the conventional directional taps 2 should be replaced to permit the supply of both AC power and RF signals to each customers 3. However, this solution is not cost efficient in view of the need to discard all of the conventional directional taps 2.

SUMMARY OF THE INVENTION

Therefore, the object of this invention is to provide a device that is coupled to and used with a standard non-power providing directional tap for drawing and mixing AC power and RF signals therefrom so as to supply the same to a customers.

Accordingly, the coupling device of this invention is adapted to be used with a standard directional tap which has an input port connected to an input signal cable that carries both AC power and RF signals, a first output port connected to an output signal cable so as to pass the AC power and RF signals to the output signal cable, a second output port that outputs the AC power and RF signals, and a number of RF signal ports that respectively output the RF signal only. The coupling device comprises a power coupling unit and a power combining unit.

The power coupling unit is adapted to be connected to the second output port of the directional tap. The power coupling unit filters out the RF signal and outputs the AC power signal from the second output port.

The power combining unit includes at least two sets of combining circuits with a common input port connected to the power coupling unit so as to receive the AC power signal therefrom. Each of the combining circuits has an RF input signal port adapted to be connected to one of the RF signal ports of the directional tap so as to receive the RF signal therefrom, and a combined output signal port with an output which is the AC power signal from the common input port and the RF signal from the RF input signal port. The combined output signal port can supply both AC power and RF signals to a customer.

BRIEF DESCRIPTION OF THE DRAWINGS

Other features and advantages of this invention will become apparent in the following detailed description of the preferred embodiments with reference to the accompanying drawings, of which:

FIG. 3(a) is an enlarged view of an encircled portion (A) found in FIG. 3;

FIG. 5 is a schematic electrical circuit diagram of the second preferred embodiment of a coupling device according to this invention;

DETAILED DESCRIPTION OF THE PREFERRED EMBODIMENTS

Figure 1:
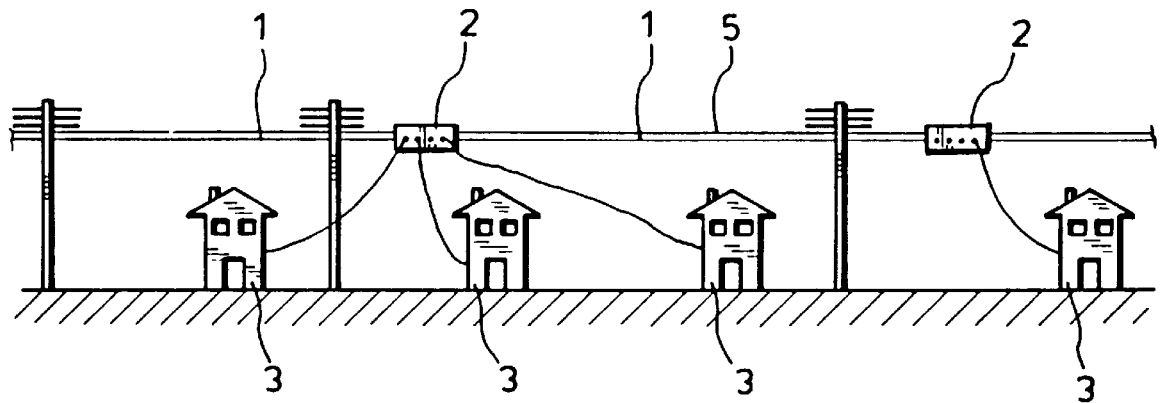
FIG. 1 illustrates how cable television signals are supplied to customer locations in a conventional overhead construction manner.
Figure 2:
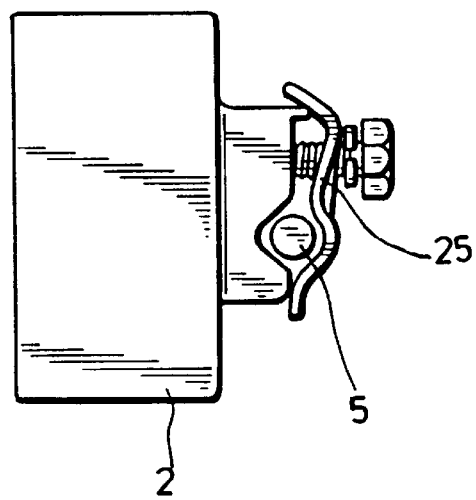
FIG. 2 is a schematic view illustrating how a conventional directional tap is mounted on an aerial support cable.

Before this invention is described in greater detail, it should be noted that like elements are denoted by the same reference numerals throughout the disclosure.

Figure 3:
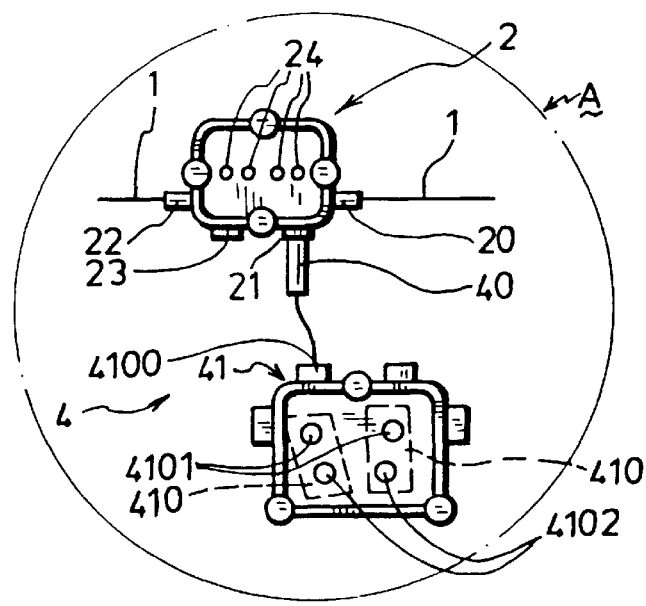
FIG. 3 illustrates how the first preferred embodiment of a coupling device according to this invention is used with a standard directional tap for drawing AC power and RF signals therefrom so as to supply the same to a customer location.
Figure 3:
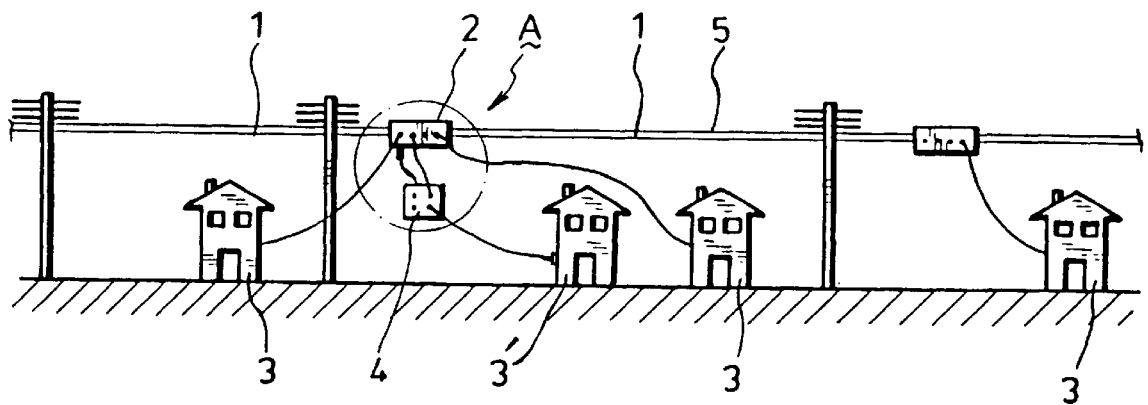

Referring to FIGS. 3 and 3(a), the first preferred embodiment of a coupling device 4 according to this invention is shown to be attached to a standard directional tap 2 so as to supply both AC power and RF signals to a customer location 3' that maybe installed with a network interface device (not shown). The directional tap 2 has two input ports 22, 23 and two output ports 20, 21. The input port 22 and the output port 20 are connected to the signal cables 1, thereby permitting continuous transmission of the AC power and RF signals through the signal cables 1. The input port 23 is not in use. The output port 21 has both AC power and RF signals available from the signal cables 1. As shown in FIG. 3(a), the directional tap 2 further has four RF signal ports 24. However, the number of RF signal ports 24 should not be limited to four since directional taps with two, six or eight RF signal ports are also known in the art.

Although the AC power and RF signals can be obtained directly from the output port 21, the signal strength thereat is not of regulated value, thereby making undesirable the direct connection of the network interface device with the output port 21.

The coupling device 4 of this invention includes a power coupling unit 40 and a power combining unit 41.

The power coupling unit 40 is connected to the output port 21 and serves to filter out the RF signal therefrom. Thus, the output of the power coupling unit 40 is the AC power signal.

The power combining unit 41 includes two sets of combining circuits 410 with a common input port 4100. Each combining circuit 410 has an RF input signal port 4101 and a combined output signal port 4102. The common input port 4100 is connected to the power coupling unit 40 so as to receive the AC power signal therefrom. The RF input signal port 4101 is connected to a respective one of the RF signal ports 24 of the directional tap 2 so as to receive the RF signal therefrom. The output at the combined output signal port 4102 is the AC power signal from the common input port 4100 and the RF signal from the RF input signal port 4101. The combined output signal port 4102 is to be connected to the network interface device that is installed in the customer 3' so as to supply both AC power and RF signals thereto.

Figure 4:
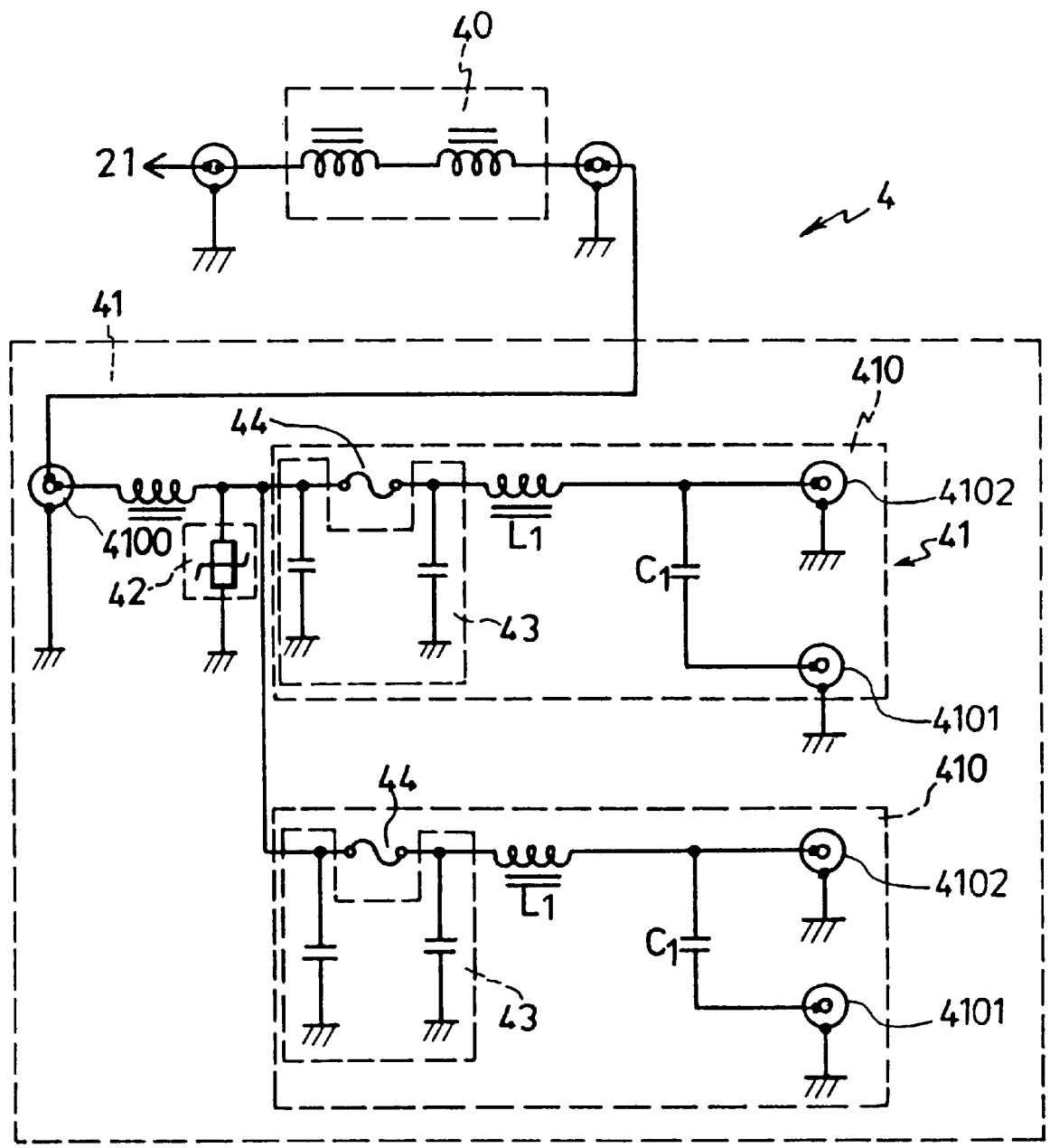
FIG. 4 is a schematic electrical circuit diagram of the first preferred embodiment.

FIG. 4 is a schematic circuit diagram of the coupling device 4. As shown, the power coupling unit 40 includes a high frequency inductor that interconnects the output port 21 of the directional tap 2 and the common input port 4100 of the power combining unit 41. In this embodiment, each combining circuit 410 of the power combining unit 41 includes an inductor L1 and a capacitor C1. The inductor L1 has a first terminal connected to the common input port 4100, and a second terminal connected to the combined output signal port 4102. The capacitor C1 couples the RF input signal port 4101 to the combined output signal port 4102. As such, each combining circuit 410 is capable of providing both AC power and RF signals to a customer 3'.

Although the combining circuits 410 of the power combining unit 41 of this embodiment utilize an inductor L1 and a capacitor C1 to combine the AC power and RF signals, other known mixing circuits may be employed to achieve the same result.

The power combining unit 41 further includes a surge protector unit 42 between the common input port 4100 and the combining circuits 410 to guard against electrical surges which may occur when the system is struck by lightning or is subjected to any other source of power surge. In addition, each combining circuit 410 may be provided with capacitor filters 43 between the common input port 4100 and the inductor L1 to minimize the presence of noise, and a fuse 44 or a thermal resistor (not shown) between the common input port 4100 and the inductor L1 to provide additional protection to the combining circuit 410.

FIG. 5 is a schematic circuit diagram of the second preferred embodiment of a coupling device 4a according to this invention. As shown, the coupling device 4a is substantially similar to the coupling device 4 described beforehand, the main difference residing in that the power combining unit 41a of the coupling device 4a of this embodiment includes more than two combining circuits 410. Thus, the coupling device 4a can be used to supply simultaneously both AC power and RF signals to more than two customers.

Figure 6:
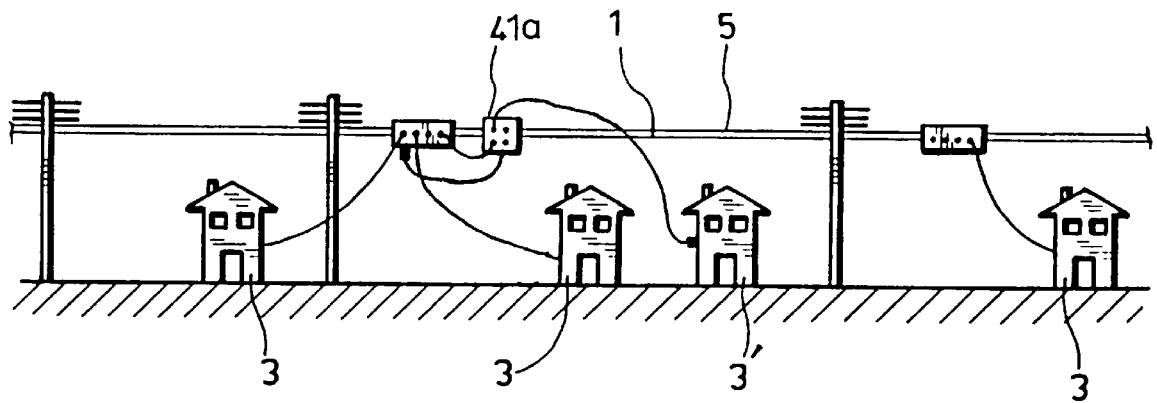
FIG. 6 illustrates how the second preferred embodiment supplies both AC power and RF signals to a customer location.
Figure 7:
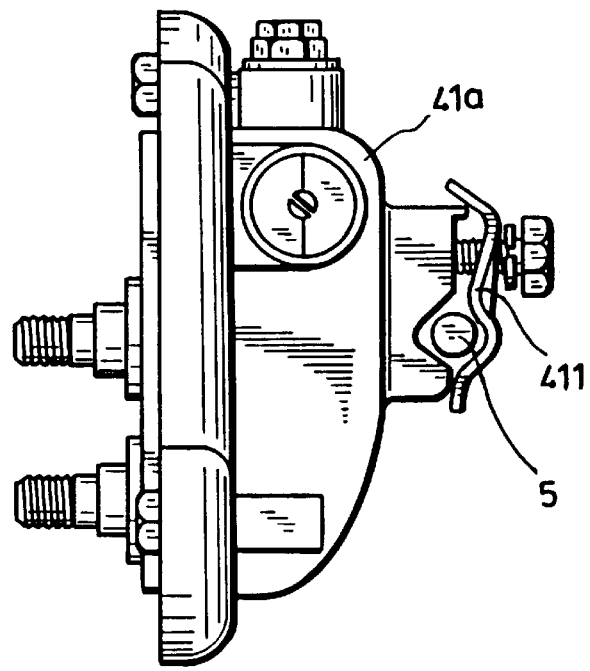
FIG. 7 is a schematic view illustrating how the second preferred embodiment is mounted on an aerial support cable.

Referring to FIGS. 6 and 7, the power combining unit 41a has a rear housing side that is provided with a clamping unit 411. The clamping unit 411 permits mounting of the power combining unit 41 on an aerial support cable 5 that is parallel to the signal cables 1 and that is used to mount the directional tap 2 thereon.

It should be noted that attachment of the coupling device should not be limited to aerial use, e.g. steel or support cables, and should include pedestal, wall, security box or flush-to-grade underground applications.

It has thus been shown that the coupling device of this invention can be used with a standard non-power providing directional tap for drawing and mixing AC power and RF signals therefrom so as to supply the same to a customer. Therefore, this invention provides a cost effective method for supplying both AC power and RF signals to a customer since there is no need to discard the conventional directional taps that are already in use. The object of this invention is thus met.

While this invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A coupling device adapted to be used with a standard directional tap which has an input port connected to an input signal cable that carries both AC power and RF signals, a first output port connected to an output signal cable so as to pass the AC power and RF signals to the output signal cable, a second output port that outputs the AC power and RF signals, and a number of RF signal ports that respectively output the RF signal, said coupling device comprising:

a power coupling unit adapted to be connected to the second output port of the directional tap, said power coupling unit filtering out the RF signal and outputting the AC power signal from the second output port; and a power combining unit including at least two sets of combining circuits with a common input port connected to said power coupling unit so as to receive the AC power signal therefrom, each of said combining circuits having an RF input signal port adapted to be connected to one of the RF signal ports of the directional tap so as to receive the RF signal therefrom, and a combined output signal port with an output which is the AC power signal from said common input port and the RF signal from the RF input signal port;

whereby, said combined output signal port can supply both AC power and RF signals to a customer.

2. The coupling device as claimed in claim 1, wherein said power coupling unit includes a high frequency inductor that is adapted to interconnect the second output port of the directional tap and said common input port of said power combining unit.

3. The coupling device as claimed in claim 1, wherein each of said combining circuits of said power combining unit includes an inductor having a first terminal connected to said common input port and a second terminal connected to said combined output signal port, and a capacitor which couples said RF input signal port to said combined output signal port.

4. The coupling device as claimed in claim 1, wherein said power combining unit further includes a surge protector unit connected to said common input port of said combining circuits.

5. The coupling device as claimed in claim 3, wherein each of said combining circuits further includes filter means between said common input port and said inductor to minimize noise.

6. The coupling device as claimed in claim 3, wherein each of said combining circuits further includes fuse means between said common input port and said inductor.

7. The coupling device as claimed in claim 1, wherein said power combining unit has a rear side provided with mounting means which is adapted to mount said power combining unit on an aerial support cable that is parallel to the first and second signal cables.

8. The coupling device as claimed in claim 7, wherein said mounting means includes a clamping unit.

* * * * *